US012599013B2

(12) United States Patent
Cheah et al.

(10) Patent No.: US 12,599,013 B2
(45) Date of Patent: Apr. 7, 2026

(54) SEMICONDUCTOR PACKAGES FOR STACKED MEMORY-ON-PACKAGE (SMOP) AND METHODS OF MANUFACTURING THE SAME

(71) Applicant: Intel Corporation, Santa Clara, CA (US)

(72) Inventors: Bok Eng Cheah, Gelugor (MY); Seok Ling Lim, Kulim Kedah (MY); Jenny Shio Yin Ong, Bayan Lepas (MY); Jackson Chung Peng Kong, Tanjung Tokong (MY); Kooi Chi Ooi, Gelugor (MY)

(73) Assignee: INTEL CORPORATION, Santa Clara, CA (US)

( * ) Notice: Subject to any disclaimer, the term of this patent is extended or adjusted under 35 U.S.C. 154(b) by 762 days.

(21) Appl. No.: 17/857,057

(22) Filed: Jul. 4, 2022

(65) Prior Publication Data

US 2024/0006324 A1     Jan. 4, 2024

(51) Int. Cl.
| | |
|---|---|
| *H01L 23/538* | (2006.01) |
| *H01L 23/00* | (2006.01) |
| *H01L 25/00* | (2006.01) |
| *H01L 25/065* | (2023.01) |

(52) U.S. Cl.
CPC ...... *H01L 23/5381* (2013.01); *H01L 23/5386* (2013.01); *H01L 24/16* (2013.01); *H01L 24/32* (2013.01); *H01L 24/73* (2013.01); *H01L 25/0652* (2013.01); *H01L 25/50* (2013.01); *H01L 2224/16145* (2013.01); *H01L 2224/16227* (2013.01); *H01L 2224/16235* (2013.01); *H01L 2224/32145* (2013.01); *H01L 2224/32225* (2013.01); *H01L 2224/73204* (2013.01); *H01L 2224/73253* (2013.01); *H01L 2924/1421* (2013.01); *H01L 2924/1432* (2013.01); *H01L 2924/1436* (2013.01); *H01L 2924/30101* (2013.01); *H01L 2924/3511* (2013.01)

(58) Field of Classification Search
CPC . H01L 23/5381; H01L 23/5386; H01L 24/16; H01L 24/32; H01L 25/0652; H01L 25/50
USPC .......................................... 257/690, 678, 777
See application file for complete search history.

(56) References Cited

U.S. PATENT DOCUMENTS

2022/0199562 A1* 6/2022 Waidhas ................. H01L 24/17

* cited by examiner

*Primary Examiner* — Jasmine J Clark
(74) *Attorney, Agent, or Firm* — VIERING, JENTSCHURA & PARTNER mbB

(57) ABSTRACT

A semiconductor package includes a package substrate, a base die including a first die surface coupled to the package substrate, and a second die surface opposite to the first die surface, and a first device including a first device surface coupled to the package substrate, and a second device surface opposite to the first device surface. The semiconductor package further includes a second device including a third device surface coupled to the second device surface, and a fourth device surface opposite to the third device surface, and a bridge including a first portion coupled to the package substrate, and a second portion coupled to the first portion, the fourth device surface and the second die surface.

15 Claims, 8 Drawing Sheets

102

104

106

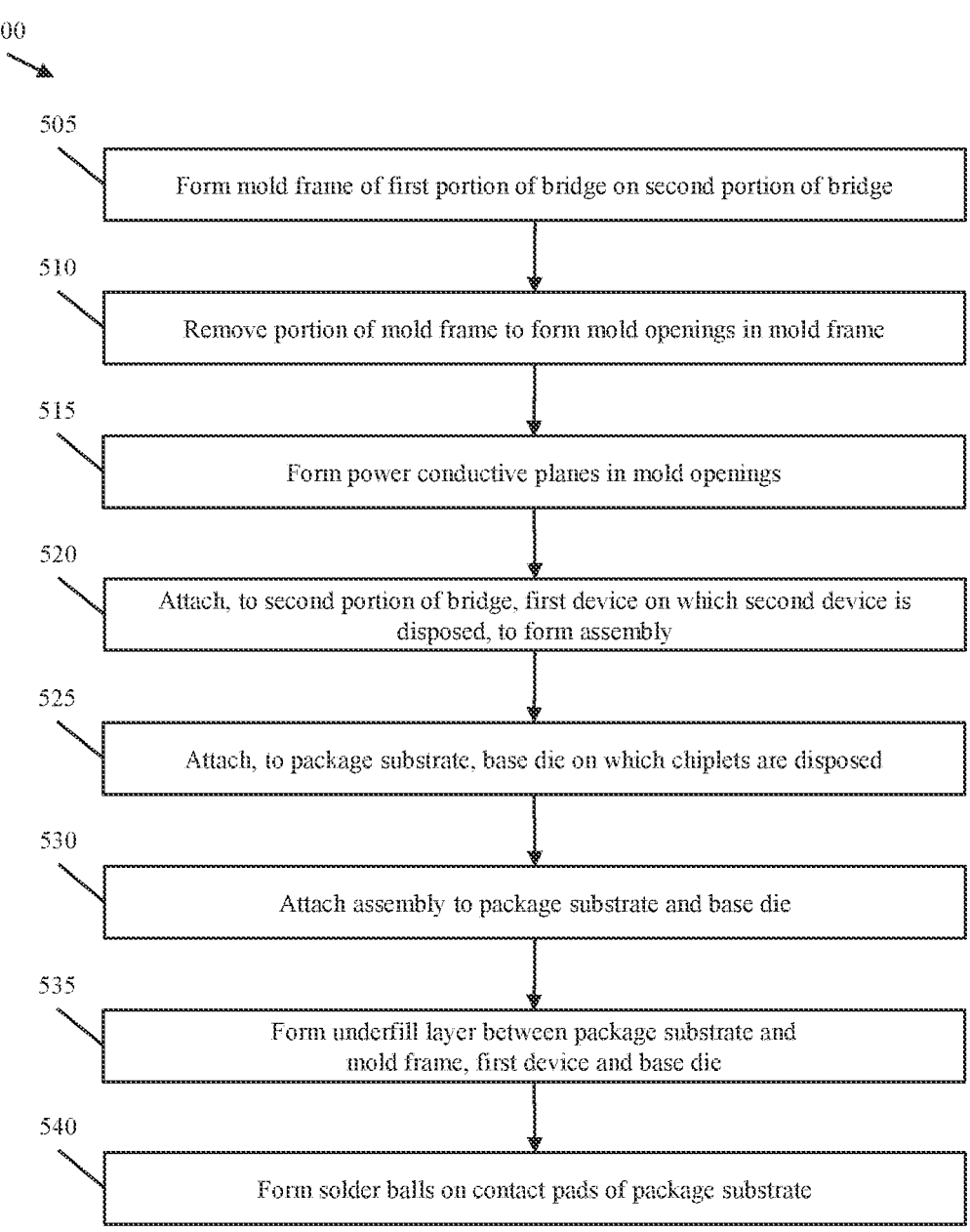

500

505 Form mold frame of first portion of bridge on second portion of bridge

510 Remove portion of mold frame to form mold openings in mold frame

515 Form power conductive planes in mold openings

520 Attach, to second portion of bridge, first device on which second device is disposed, to form assembly 525 Attach, to package substrate, base die on which chiplets are disposed 530 Attach assembly to package substrate and base die 535 Form underfill layer between package substrate and mold frame, first device and base die 540 Form solder balls on contact pads of package substrate

FIG. 5

SEMICONDUCTOR PACKAGES FOR STACKED MEMORY-ON-PACKAGE (SMOP) AND METHODS OF MANUFACTURING THE SAME

BACKGROUND

In semiconductor manufacturing, there may be challenges in device form-factor, e.g., package real-estate expansion due to on-package dynamic random access memory (DRAM) devices scaling (e.g., ×4 or ×8) for improved computing performance. That is, in an example memory-on-package architecture with ×2 DRAM devices mounted lateral to a central processing unit (CPU), a system-on-chip (SOC) and/or a graphic processing unit (GPU) within a package substrate, further scaling of laterally attached on-package memory devices may inhibit device miniaturization.

Moreover, in semiconductor manufacturing, there may be challenges with signal integrity impairments, specifically, electrical coupling noises, e.g., far-end crosstalk (FEXT) induced by tightly coupled transmission lines between the CPU, the SOC and/or the GPU and the DRAM devices on the package substrate. Silicon circuitry features (e.g., equalization and/or crosstalk cancellation) may be implemented, but they may be power-consuming. There may further be computing performance degradation ascribed to signal latency contributed by lateral package interconnects.

Current solutions to cope with increased memory devices and/or bandwidth density may include package and/or board real-estate expansion to house additional DRAM devices for performance scaling. Alternatively, DRAM device form-factor miniaturization (e.g., DRAM silicon and/or package footprint reduction) may further be pursued to mitigate device form-factor expansion and/or signal integrity deterioration. Disadvantages of these current solutions may include package and/or printed circuit board form-factor expansion, which may lead to bulky devices, increased device reliability risks, package warpage control challenges and/or an increased package substrate footprint.

BRIEF DESCRIPTION OF THE DRAWINGS

In the drawings, like reference characters generally refer to the same parts throughout the different views. The drawings are not necessarily to scale, emphasis instead generally being placed upon illustrating the present disclosure. The dimensions of the various features or elements may be arbitrarily principles expanded or reduced for clarity. In the following description, various aspects of the present disclosure are described with reference to the following drawings, in which:

FIG. 5 is a flow diagram of the method of FIGS. 4A-4G; and

DETAILED DESCRIPTION

Figure 1A:
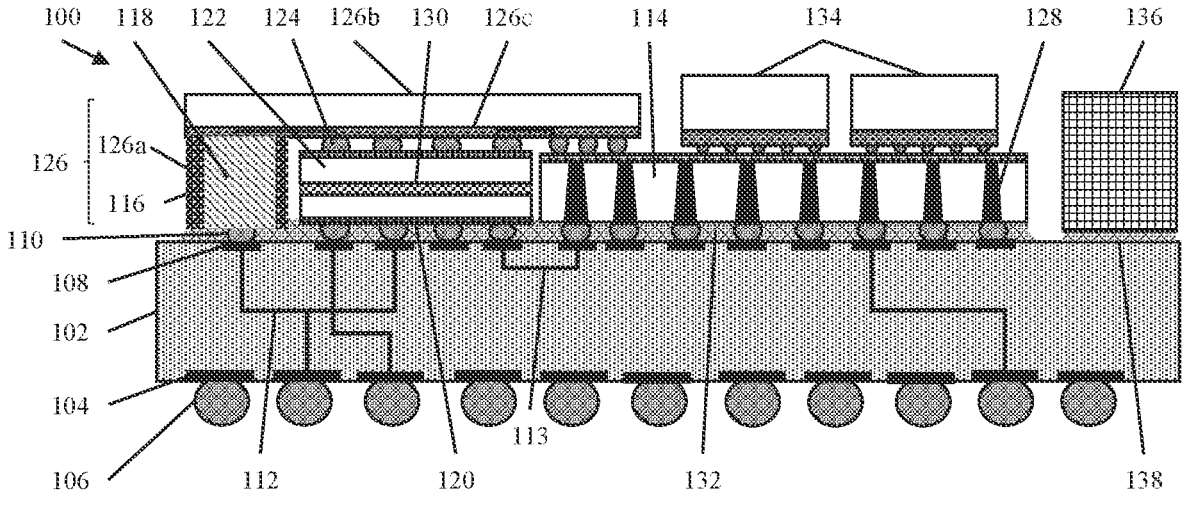
FIG. 1A is a cross-sectional view of a semiconductor package for stacked memory-on-package (SMOP), according to aspects of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to semiconductor packages for SMOP and methods of manufacturing the same.

A present semiconductor package includes a package substrate, a base die including a first die surface coupled to the package substrate, and a second die surface opposite to the first die surface, and a first device including a first device surface coupled to the package substrate, and a second device surface opposite to the first device surface. The semiconductor package further includes a second device including a third device surface coupled to the second device surface, and a fourth device surface opposite to the third device surface, and a bridge including a first portion coupled to the package substrate, and a second portion coupled to the first portion, the fourth device surface and the second die surface.

In another aspect, a method of manufacturing a semiconductor package pursuant to the present disclosure includes forming one or more epoxy mold layers on a metal redistribution layer (RDL) of a bridge, removing a portion of the one or more epoxy mold layers to form one or more openings in the one or more epoxy mold layers, and forming one or more first conductive planes in the one or more openings. The method further includes attaching, to the metal RDL, a first device on which a second device is disposed, to form an assembly, attaching, to a package substrate, a base die on which one or more chiplets are disposed, and attaching the assembly to the package substrate and the base die that are attached to each other, so that the one or more first conductive planes and the first device are coupled to the package substrate and the metal RDL is coupled to the base die.

In yet another aspect, a present computing device includes a semiconductor package including a package substrate, a base die including a first die surface coupled to the package substrate, and a second die surface opposite to the first die surface, and a first device including a first device surface coupled to the package substrate, and a second device surface opposite to the first device surface. The semiconductor package further includes a second device including a third device surface coupled to the second device surface, and a fourth device surface opposite to the third device surface, a bridge including a first portion and a second portion coupled to the first portion, the fourth device surface and the second die surface, wherein the first portion comprises one or more first conductive planes interposed between the package substrate and the second portion of the bridge, and coupled to a metal redistribution layer (RDL) having one or more second conductive planes in the second portion of the bridge.

Advantageously, the above aspects may allow for device miniaturization through stacked device architecture that allows 2× memory device (e.g., memory die and/or package) density scaling with minimum package real-estate trade-off. The above aspects may further allow for enhanced electrical performance, e.g., reduced signal latency between a CPU, a GPU or a SOC (e.g., a processor) and DRAM devices through shorter and less distorted signal transmission paths, namely, direct signal interconnects between the processor and the multiple memory devices arranged thereby. The enhanced electrical performance may further be achieved through reduced effective self-resistance (ESR) for a power delivery network through conductive corridors arranged at a periphery of a bridge and stacked devices.

Figure 1B:
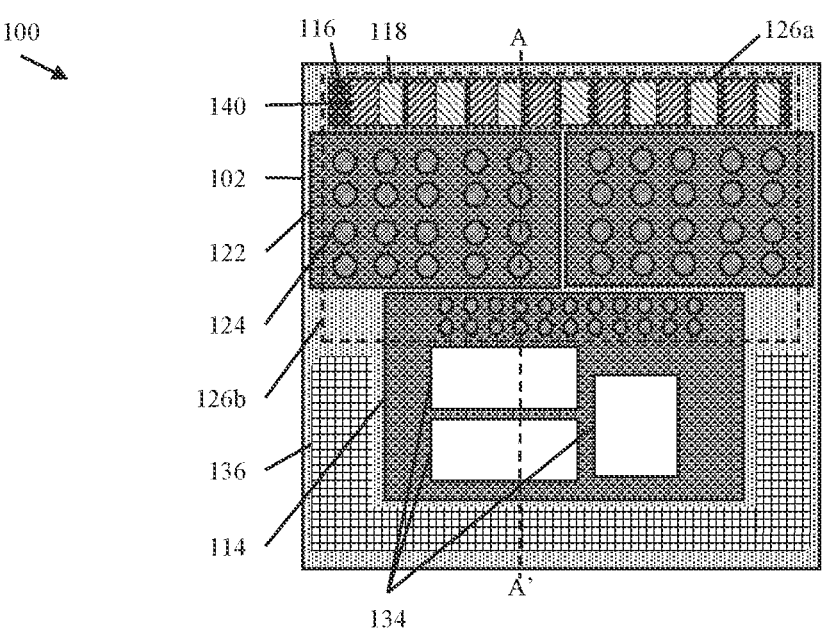
FIG. 1B is a top view of the semiconductor package of FIG. 1A.

FIG. 1A is a cross-sectional view of a semiconductor package 100 for SMOP, according to aspects of the present disclosure. FIG. 1B is a top view of the semiconductor package 100 of FIG. 1A.

In detail, FIG. 1A is a cross-sectional view of the semiconductor package 100 along a line A-A' shown in FIG. 1B. Referring to FIGS. 1A and 1B, the semiconductor package 100 includes a package substrate 102 (e.g., a silicon or organic substrate) including a first surface on which contact pads 104 are disposed. Solder balls 106 are respectively disposed on the contact pads 104. The package substrate 102 further includes a second surface on which contact pads 108 are disposed. Solder bumps 110 are respectively disposed on the contact pads 108. Wires 112 connect a portion of the of the solder bumps 110 to a portion of the solder balls 106.

The semiconductor package 100 further includes a base die 114 disposed on a first portion of the solder bumps 110 for the package substrate 102. The base die 114 may include a silicon interposer or a stack-up of metal redistribution layers including transistor devices.

The semiconductor package 100 further includes a first device 120 and a second device 122, each of which may include, e.g., a DRAM die and/or package. The first device 120 and the second device 122 are disposed adjacent to the base die 114. The first device 120 is coupled to a first surface of the base die 114 via a second portion of the solder bumps 110 for communicating signals, and is coupled to the second surface of the package substrate 102 via a third portion of the solder bumps 110 for power delivery. The second device 122 is disposed on or over the first device 120. The second device 122 is coupled to a second surface of the base die 114 that is opposite to the first surface of the base die 114, via a first portion of solder bumps 124 and a bridge 126 for communicating signals, and is coupled to a surface of the bridge 126 via a second portion of the solder bumps 124 for power delivery. The base die 114 includes through silicon vias (TSVs) 128 connecting the first portion of the solder bumps 110 to the second surface of the base die 114 and/or the first portion of the solder bumps 124.

Moreover, the semiconductor package 100 includes a first adhesive layer 130 interposed between the first device 120 and the second device 122. For example, the first adhesive layer 130 may include polyamides, polyesters, polyethylene, polyurethanes or polypropylene that adhesively couples the first device 120 to the second device 122. In an aspect, the first adhesive layer 130 may include a first thickness e.g., ranging from 10 to 100 μm, configured together with the first device 120, the second device 122 and the solder bumps 124 to achieve a second thickness ranging from 50 to 500 μm.

Moreover, the semiconductor package 100 includes the bridge 126 including a first portion 126a and a second portion 126b extending over the first device 120, the second device 122 and a portion of the base die 114. The first portion 126a includes a mold frame 116 disposed on end portions of the solder bumps 110 for the package substrate 102. For example, the mold frame 116 may include one or more epoxy mold layers, and may have a third thickness ranging from 50 to 500 μm corresponding to the second thickness. In an aspect, the first portion 126a includes a first footprint ranging from 2 mm×4 mm to 5 mm×20 mm. In an aspect, the second portion 126b includes a second footprint greater than the first footprint ranging from 8 mm×4 mm to 15 mm×20 mm.

The first portion 126a further includes power conductive planes 118 respectively extending from the end portions of the solder bumps 110 and a first surface of the mold frame 116 to a second surface of the mold frame 116 that is opposite to the first surface. The power conductive planes 118 may include electrically conductive materials, e.g., copper, silver or tin-silver (SnAg) solder composites. The power conductive planes 118 may further be electrically connected to a power supply voltage ($V_{cc}$) of e.g., 0.5 V and/or 1.0 V, to facilitate power delivery between the package substrate 102 and the first device 120, the second device 122 and the base die 114. For example, the power conductive planes 118 may have a thickness ranging from 50 to 500 μm corresponding to the second and third thicknesses.

Moreover, the first portion 126a includes ground conductive planes 140 adjacent to the power conductive planes 118 and respectively extending from the end portions of the solder bumps 110 and the first surface of the mold frame 116 to the second surface of the mold frame 116. The ground conductive planes 140 may include electrically conductive materials, e.g., copper, silver or tin-silver (SnAg) solder composites. The ground conductive planes 140 may further be electrically connected to a ground reference voltage ($V_{ss}$), to facilitate power delivery between the package substrate 102 and the first device 120, the second device 122 and the base die 114, with a reduced alternating current inductance loop. For example, the ground conductive planes 140 may have a thickness ranging from 50 to 500 μm corresponding to the second and third thicknesses.

The second portion 126b includes a silicon or organic substrate, and a metal redistribution layer (RDL) 126c disposed thereon. The metal RDL 126c includes a power plane, a ground reference plane and routing traces, and may include a thickness ranging from 2 to 40 μm. The power conductive planes 118 and the ground conductive planes 140 are respectively coupled to the power plane and the ground reference plane in the metal RDL 126c through metal diffusion (e.g., copper plating) and/or a solder layer, to facilitate direct power delivery from the package substrate 102 to the second device 122 and the base die 114.

The first portion 126a is coupled to the package substrate 102 via the power conductive planes 118, the ground conductive planes 140, the end portions of the solder bumps 110 and the second portion 126b is coupled to the second device 122 and the second surface of base die 114 via the solder bumps 124.

The semiconductor package 100 further includes an underfill layer 132 interposed between the second surface of the package substrate 102 and the first surface of the mold frame 116, the first device 120 and the first surface of the base die 114. For example, the underfill layer 132 may include epoxy polymer and silica composites that provides mechanical support for these elements of the semiconductor package 100.

Moreover, the semiconductor package 100 includes chiplets 134, e.g., a CPU, a GPU, an SOC, a radio frequency integrated circuit (RFIC), a deep learning processor (DLP), a neural network processor and/or an input/output (I/O) tile. The chiplets 134 are coupled to the second surface of the base die 114. At least one of the chiplets 134 is coupled to the second device 122 through the routing traces of the metal RDL 126*c* for signal transmissions, e.g., a transmission of a memory signal. At least one of the chiplets 134 is coupled to the first device 120 through the TSVs 128, the first portion of the solder bumps 110 and package routing traces 113 for signal transmissions, e.g., a transmission of a memory signal.

The semiconductor package 100 further includes a stiffener 136 disposed on or over the package substrate 102, and a second adhesive layer 138 interposed between the stiffener 136 and the package substrate 102. The stiffener 136 may include aluminum or stainless steel, and the second adhesive layer 138 may include polyamides, polyesters, polyethylene, polyurethanes or polypropylene that adhesively couples the stiffener 136 to the package substrate 102.

Referring to FIG. 1B, the second portion 126*b* of the bridge 126 is shown to be transparent (e.g., with dashed lines) to clearly show elements underneath the second portion 126*b*, such as, for example, the solder bumps 124, the power conductive planes 118 and the ground conductive planes 140.

Advantageously, by stacking the second device 122 on top of the first device 120, the semiconductor package 100 may allow for device miniaturization, increased density scaling of the first and second devices 120 and 122 and minimum real-estate trade-off of the package substrate 102. Further, the solder bumps 110 and 124 and the TSVs 128 may respectively serve as direct signal interconnects between the base die 114 and the first and second devices 120 and 122, which may reduce lengths of communication routes and thus communication signal latency between these elements. Moreover, the semiconductor package 100 may allow for shorter power delivery for the first and second devices 120 and 122 through the power conductive planes 118 and the ground conductive planes 140.

Figure 2A:
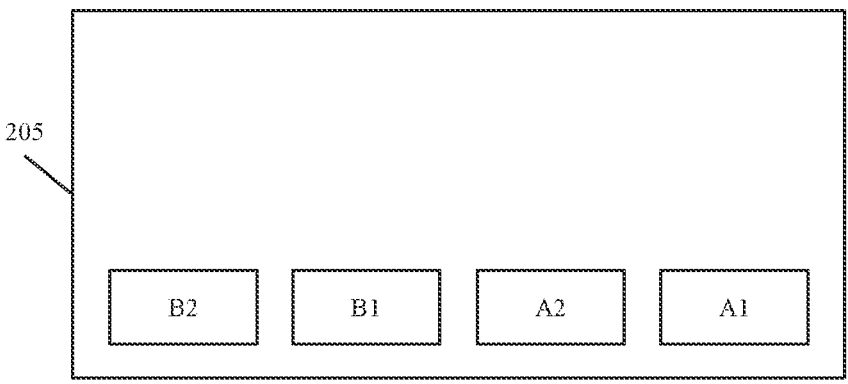
FIG. 2A is a block diagram of a serial configuration of two sets of memory circuitry blocks in a chiplet.
Figure 2B:
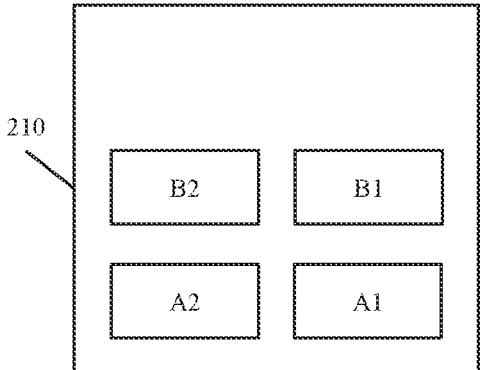
FIG. 2B is a block diagram of a parallel configuration of two sets of memory circuitry blocks in a chiplet, according to aspects of the present disclosure.

FIG. 2A is a block diagram of a serial configuration 205 of two sets of memory circuitry blocks (A1, A2) and (B1, B2) in a chiplet e.g., one of the chiplets 134 of FIGS. 1A and 1B. FIG. 2B is a block diagram of a parallel configuration 210 of two sets of memory circuitry blocks (A1, A2) and (B1, B2) in a chiplet, according to aspects of the present disclosure.

Base area reduction (e.g., of the chiplets 134 and/or base die 114 of FIGS. 1A and 1B) may be attainable through a reduced shoreline (e.g., an x-axis) by using the parallel configuration 210 (a parallel circuitry floorplan) shown in FIG. 2B, in which the two sets of memory circuitry blocks (A1, A2) and (B1, B2) extend along the shoreline and another axis (e.g., a y-axis). The shoreline is reduced compared to a shoreline (e.g., an x-axis) of the conventional serial configuration 205 (a serial circuitry floorplan) shown in FIG. 2A, in which the two sets of memory circuitry blocks (A1, A2) and (B1, B2) extend along only the shoreline. The parallel configuration 210 is allowed in the semiconductor package 100 of FIGS. 1A and 1B due to the stacking of the first and second devices 120 and 122.

Figures 3A, 3B:
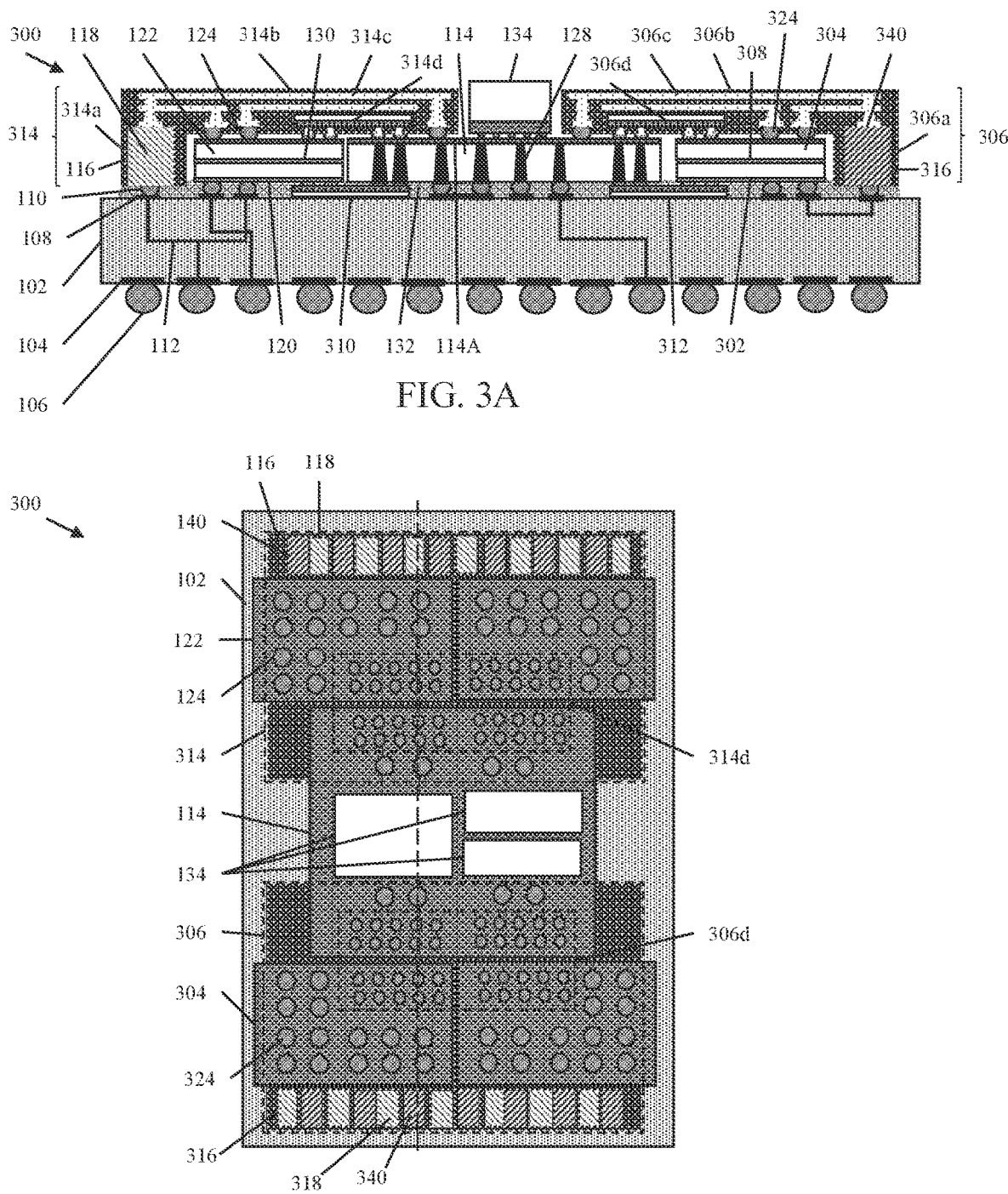
FIG. 3A is a cross-sectional view of a semiconductor package for SMOP, according to other aspects of the present disclosure.
FIG. 3B is a top view of the semiconductor package of FIG. 3A.

FIG. 3A is a cross-sectional view of a semiconductor package 300 for SMOP, according to other aspects of the present disclosure. FIG. 3B is a top view of the semiconductor package 300 of FIG. 3A.

In detail, FIG. 3A is a cross-sectional view of the semiconductor package 300 along a line A-A' shown in FIG. 3B. Referring to FIGS. 3A and 3B, the semiconductor package 300 includes most of elements of the semiconductor package 100 of FIGS. 1A and 1B.

The semiconductor package 300 further includes a third device 302 and a fourth device 304, each of which may include, e.g., a DRAM die and/or package. The third device 302 and the fourth device 304 are disposed adjacent to the base die 114. The third device 302 is coupled to the first surface of the base die 114 via a fourth portion of the solder bumps 110 including a first diameter ranging from 10 to 30 μm for communicating signals, and is coupled to the second surface of the package substrate 102 via the third portion of the solder bumps 110 including a second diameter (e.g., ranging from 40 to 100 μm) greater than the first diameter for power delivery. The fourth device 304 is disposed on or over the third device 302. The fourth device 304 is coupled to the second surface of the base die 114 via a first portion of subsequent solder bumps 324 and a bridge 306 for communicating signals, and is coupled to the surface of the bridge 306 via a second portion of the subsequent solder bumps 324 for power delivery.

Moreover, the semiconductor package 300 includes a third adhesive layer 308 interposed between the third device 302 and the fourth device 304. For example, the third adhesive layer 308 may include polyamides, polyesters, polyethylene, polyurethanes or polypropylene that adhesively couples the third device 302 to the fourth device 304. In an aspect, the third adhesive layer 308 may include a fourth thickness e.g., ranging from 10 to 100 μm, configured together with the third device 302, the fourth device 304 and the subsequent solder bumps 324 to achieve a fifth thickness ranging from 50 to 500 μm corresponding to the second thickness.

The semiconductor package 300 further includes a first silicon bridge 310 interposed between the package substrate 102 and the base die 114. The first silicon bridge 310 couples the first device 120 to the first surface of the base die 114 via the fourth portion of the solder bumps 110 for communicating signals. The first device 120 is coupled to and in communication with the chiplets 134 through the first silicon bridge 310, the TSVs 128 and a metal RDL 114A of the base die 114.

Moreover, the semiconductor package 300 includes a second silicon bridge 312 interposed between the package substrate 102 and the base die 114. The second silicon bridge 312 couples the third device 302 to the first surface of the base die 114 via the fourth portion of the solder bumps 110 for communicating signals. The third device 302 is coupled to and in communication with the chiplets 134 through the second silicon bridge 312, the TSVs 128 and the metal RDL 114A of the base die 114.

The semiconductor package 300 further includes a bridge 314 including a first portion 314*a* and a second portion 314*b* extending over the first device 120, the second device 122 and a portion of the base die 114. The first portion 314*a* includes a mold frame 116, power conductive planes 118 and ground conductive planes 140 coupled to the package substrate 102 through the end portions of the solder bumps 110 for the package substrate 102. The second portion 314*b* is coupled to the second device 122 and the second surface of base die 114 via the solder bumps 124. In an aspect, the first portion 314a includes a third footprint ranging from 2 mm×4 mm to 5 mm×20 mm. In an aspect, the second portion 314b includes a fourth footprint greater than the third footprint ranging from 8 mm×4 mm to 15 mm×20 mm. Unlike the second portion 126b of FIG. 1A, the second portion 314b includes one or more epoxy mold layers and is thus integrally formed with the first portion 314a.

The bridge 314 includes a metal RDL 314c. The metal RDL 314A facilitates power delivery from the power conductive planes 118 to the second device 122 and/or the chiplets 134 through the metal RDL 114A of the base die 114. In an aspect, the metal RDL 314A facilitates interconnects between the second device 122 and the base die 114 or the chiplets 134 for communication. In an aspect, the bridge 314 includes a silicon bridge 314d that are embedded in the second portion 314b. The silicon bridge 314d facilitates high-density interconnects between the second device 122 and the base die 114 or the chiplets 134 for communication. Such configurations allow miniaturization of the base die 114 and/or the chiplets 134 and reduction of ESR of a power delivery network for improved power integrity.

Moreover, the semiconductor package 300 includes the bridge 306 including a subsequent first portion 306a and a subsequent second portion 306b extending over the third device 302, the fourth device 304 and a portion of the base die 114. The subsequent first portion 306a includes a subsequent mold frame 316, subsequent power conductive planes 318 and subsequent ground conductive planes 340 coupled to the package substrate 102 through subsequent end portions of the solder bumps 110 for the package substrate 102. The second portion 306b is coupled to the fourth device 304 and the second surface of base die 114 via the subsequent solder bumps 324. In an aspect, the subsequent first portion 306a includes a subsequent first footprint ranging from 2 mm×4 mm to 5 mm×20 mm. In an aspect, the subsequent second portion 306b includes a subsequent second footprint greater than the subsequent first footprint ranging from 8 mm×4 mm to 15 mm×20 mm.

The bridge 306 includes a metal RDL 306c. The metal RDL 306c facilitates power delivery from the subsequent power conductive planes 318 to the fourth device 304 and/or the chiplets 134 through the metal RDL 114A of the base die 114. In an aspect, the metal RDL 306c facilitates interconnects between the fourth device 304 and the base die 114 or the chiplets 134 for communication. In an aspect, the bridge 306 includes a silicon bridge 306d that are embedded in the subsequent second portion 306b. The silicon bridge 306d facilitates high-density interconnects between the fourth device 304 and the base die 114 or the chiplets 134 for communication. Such configurations allow miniaturization of the base die 114 and/or the chiplets 134 and reduction of the ESR of the power delivery network for improved power integrity.

Referring to FIG. 3B, the second portions 306b and 314b of the bridges 306 and 314 are shown to be transparent (e.g., with dashed lines) to clearly show elements underneath the bridges 306 and 314, such as, for example, the solder bumps 124, 324, the power conductive planes 118, 318 and the ground conductive planes 140, 340. The silicon bridges 306d and 314d respectively embedded in the bridges 306 and 314 are also shown to be transparent (e.g., with dashed lines) to clearly show elements underneath the silicon bridges 306d and 314d, such as, for example, the solder bumps 124, 324.

FIGS. 4A, 4B, 4C, 4D, 4E, 4F and 4G are cross-sectional views illustrating a method 500 of manufacturing the semiconductor package 100 of FIG. 1A, according to aspects of the present disclosure. FIG. 5 is a flow diagrams of the method 500 of FIGS. 4A-4G.

Figure 4A:
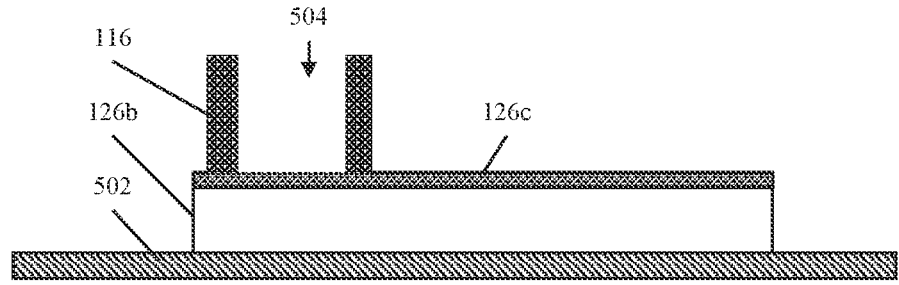
FIGS. 4A, 4B, 4C, 4D, 4E, 4F and 4G are cross-sectional views illustrating a method of manufacturing the semiconductor package of FIG. 1A, according to aspects of the present disclosure.

Referring to FIGS. 4A and 5, in operation 505, the method 500 includes forming the mold frame 116 of the first portion 126a of the bridge 126 on the second portion 126b of the bridge 126 (e.g., the metal RDL 126c) disposed on a carrier 502. The mold frame 116 of the first portion 126a of the bridge 126 may be formed on the second portion 126b of the bridge via a transfer, injection, and compress molding process.

In operation 510, the method 500 includes removing a portion of the mold frame 116 to form mold openings 504 (e.g., a trench or through via) in the mold frame 116. The portion of the mold frame 116 may be removed via laser drilling, etching or chemical etching.

Figure 4B:
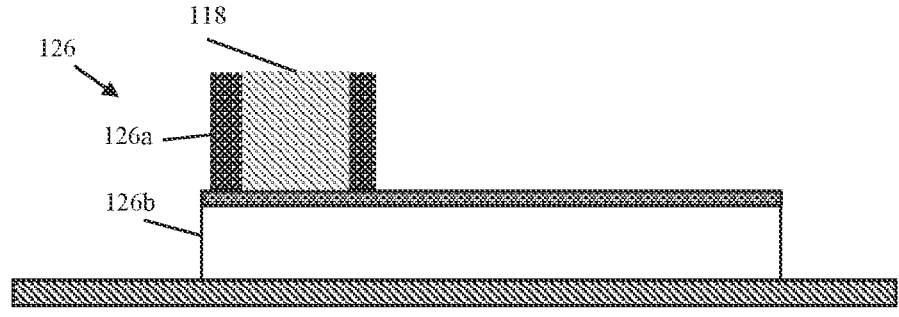

Referring to FIGS. 4B and 5, in operation 515, the method 500 includes forming the power conductive planes 118 in the mold openings 504, to form the first portion 126a of the bridge 126 and the bridge 126. The power conductive planes 118 may be deposited in the mold openings 504 via electroplating or solder paste printing.

Figure 4C:
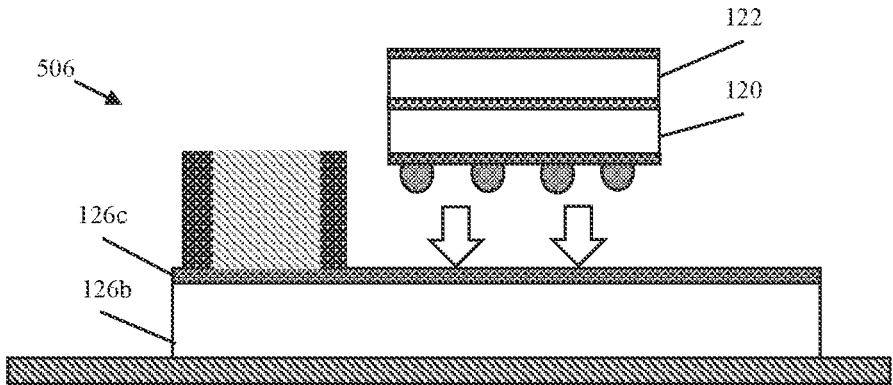

Referring to FIGS. 4C and 5, in operation 520, the method 500 includes attaching, to the second portion 126b of the bridge 126 (e.g., the metal RDL 126c), the first device 120 on which the second device 122 is disposed, to form an assembly 506. The first and second devices 120 and 122 may be attached to the second portion 126b of the bridge 126 via a thermal compression bonding and reflow process.

Figure 4D:
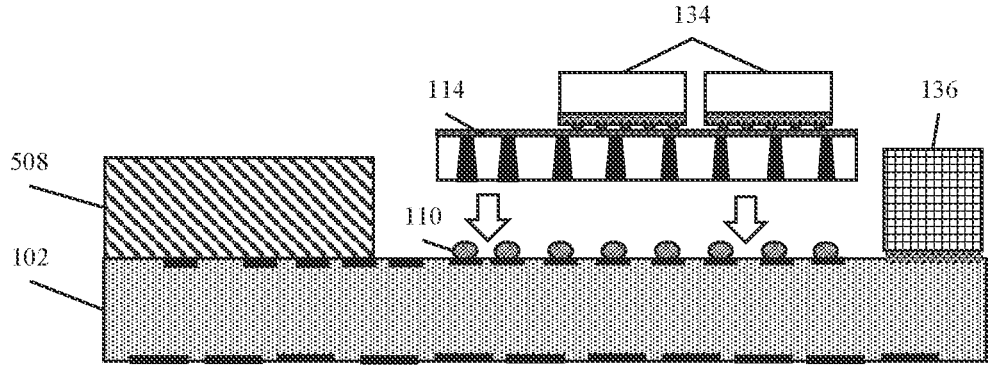

Referring to FIGS. 4D and 5, in operation 525, the method 500 includes attaching, to the package substrate 102, the base die 114 on which the chiplets 134 are disposed, via the first portion of the solder bumps 110 interposed between the stiffener 136 and an assembly media 508. The base die 114 and the chiplets 134 may be attached to the package substrate 102 via a thermal compression bonding and reflow process.

Figure 4E:
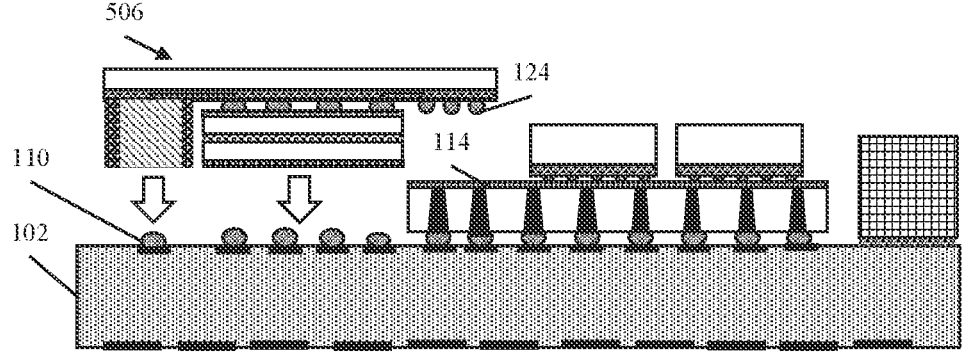

Referring to FIGS. 4E and 5, in operation 530, the method 500 includes attaching the assembly 506 to the package substrate 102 and the base die 114 that are attached to each other, via the end portions of the solder bumps 110 and the second portion of the solder bumps 124, respectively. The assembly 506 may be attached to the package substrate 102 and the base die 114 via a thermal compression bonding and reflow process. The assembly 506 may be attached to the package substrate 102 and the base die 114 so that the first portion 126a (e.g., the power conductive planes 118) and the first device 120 are coupled to the package substrate 102 and the second portion 126b of the bridge 126 (e.g., the metal RDL 126c) is coupled to the base die 114. The method 500 may further include removing the assembly media 508 from the package substrate 102 prior to the attaching the assembly 506 to the package substrate 102 and the base die 114.

Figure 4F:
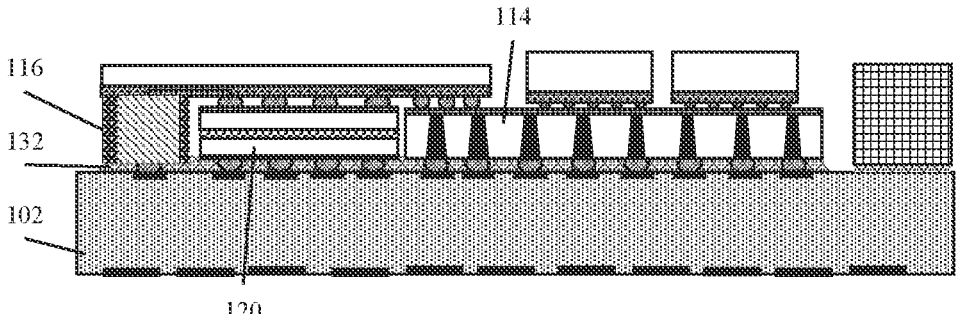

Referring to FIGS. 4F and 5, in operation 535, the method 500 includes forming the underfill layer 132 between the second surface of the package substrate 102 and the first surface of the mold frame 116, the first device 120 and the first surface of the base die 114. The underfill layer 132 may be formed via a capillary dispense or no-flow underfill process to provide mechanical support for these elements of the semiconductor package 100.

Figure 4G:
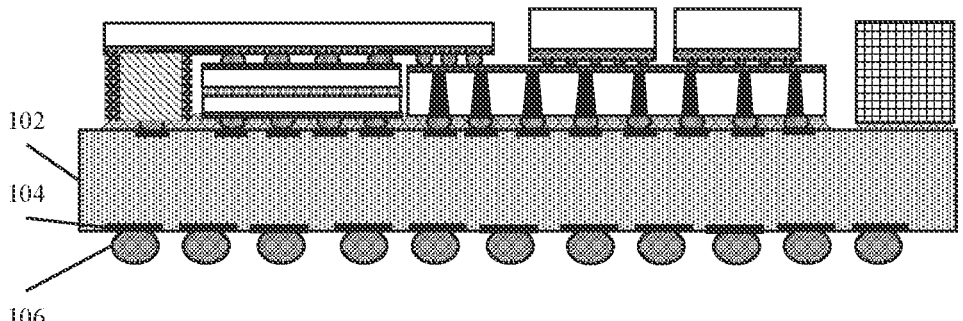

Referring to FIGS. 4G and 5, in operation 540, the method 500 includes forming the solder balls 106 on the contact pads 104 of the package substrate 102. The solder balls 106 may be formed via a solder reflow and surface mounting process.

The methods and sequence of steps presented above are intended to be examples for manufacturing the semiconductor package, according to aspects of the present disclosure. It will be apparent to those ordinary skilled practitioners that the foregoing process operations may be modified without departing from the spirit of the present disclosure.

Figure 6:
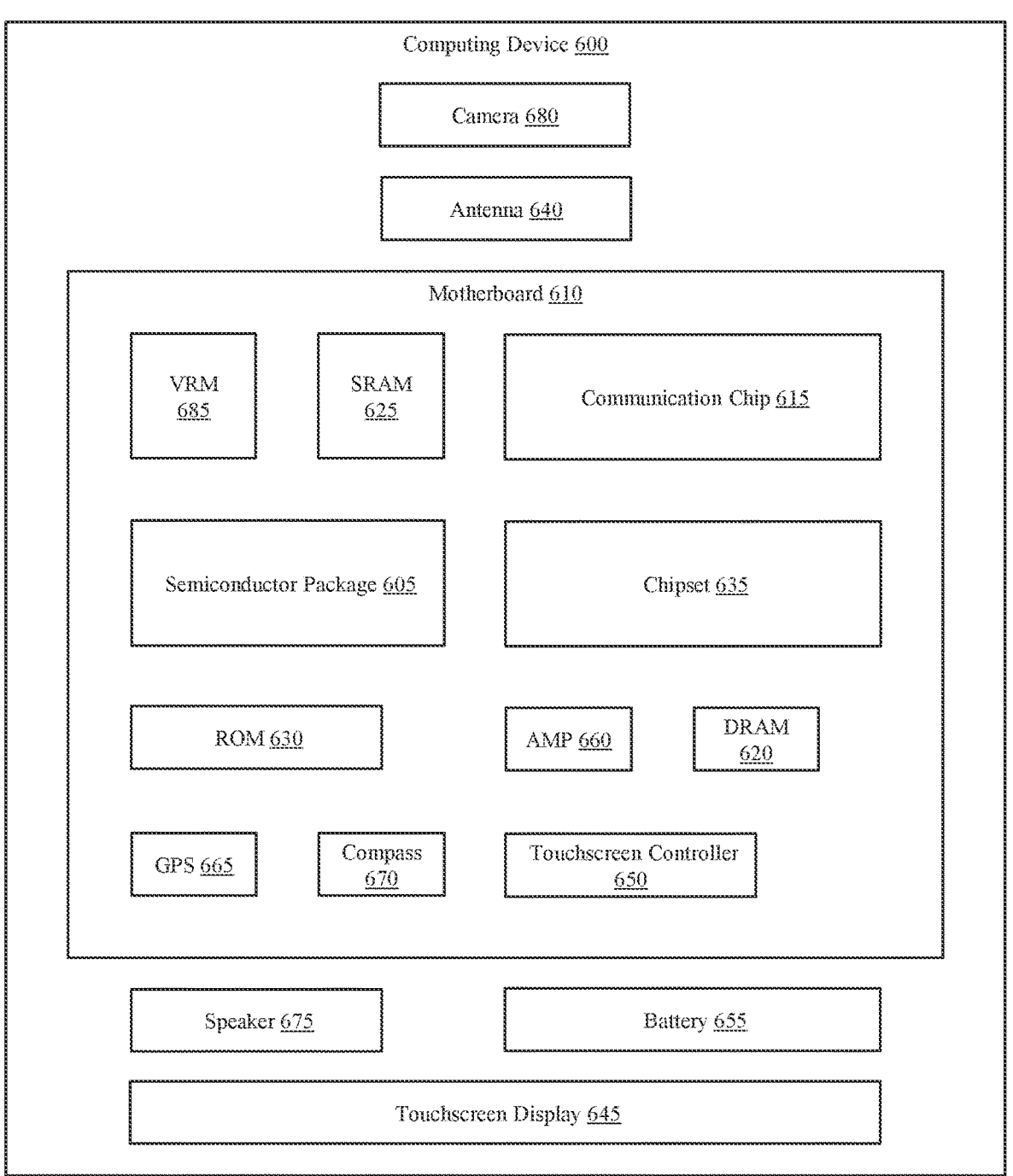
FIG. 6 is a block diagram of a computing device including a semiconductor package for SMOP, according to aspects of the present disclosure.

FIG. 6 is a block diagram of a computing device 600 including a semiconductor package 605 for SMOP, according to aspects of the present disclosure.

Referring to FIG. 6, the computing device 600 may house a board such as a motherboard 610. The semiconductor package 605, according to the aspects of the present disclosure, may be incorporated as part of the motherboard 610. The motherboard 610 may further include a number of components, including, but not limited to, at least one communication chip 615. In some implementations, the at least one communication chip 615 may also be physically and electrically coupled to the motherboard 610. In further implementations, the communication chip 615 may be part of the semiconductor package 605.

Depending on its applications, the computing device 600 may include other components that may or may not be physically and electrically coupled to the motherboard 610. These other components may include, but are not limited to, volatile memory (e.g., DRAM 620 and SRAM 625), non-volatile memory (e.g., ROM 630), flash memory, a graphics processor, a digital signal processor, a crypto processor, a chipset 635, an antenna 640, a display, a touchscreen display 645, a touchscreen controller 650, a battery 655, an audio codec, a video codec, a power amplifier (AMP) 660, a global positioning system (GPS) device 665, a compass 670, a Geiger counter, an accelerometer, a gyroscope, a speaker 675, a camera 680, a voltage regulator module (VRM) 685 and a mass storage device (such as hard disk drive, compact disk (CD), digital versatile disk (DVD), and so forth).

The communication chip 615 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 615 may implement any of a number of wireless standards or protocols, including but not limited to Institute for Electrical and Electronics Engineers (IEEE) standards including Wi-Fi (IEEE 1002.11 family), IEEE 1002.16 standards (e.g., IEEE 1002.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 1002.16 compatible BWA networks are generally referred to as WiMAX networks, an acronym that stands for Worldwide Interoperability for Microwave Access, which is a certification mark for products that pass conformity and interoperability tests for the IEEE 1002.16 standards.

The communication chip 615 may also operate in accordance with a Global System for Mobile Communication (GSM), General Packet Radio Service (GPRS), Universal Mobile Telecommunications System (UNITS), High Speed Packet Access (HSPA), Evolved HSPA (E-HSPA), or LTE network. The communication chip 615 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 615 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 615 may operate in accordance with other wireless protocols in other aspects.

The computing device 600 may include communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 600 may be a mobile computing device. In further implementations, the computing device 600 may be any other electronic device that processes data.

To more readily understand and put into practical effect the present semiconductor packages and methods, particular aspects will now be described by way of examples. For the sake of brevity, duplicate descriptions of features and properties may be omitted.

EXAMPLES

Example 1 provides a semiconductor package including a package substrate, a base die including a first die surface coupled to the package substrate, and a second die surface opposite to the first die surface, and a first device including a first device surface coupled to the package substrate, and a second device surface opposite to the first device surface. The semiconductor package further includes a second device including a third device surface coupled to the second device surface, and a fourth device surface opposite to the third device surface, and a bridge including a first portion coupled to the package substrate, and a second portion coupled to the first portion, the fourth device surface and the second die surface.

Example 2 may include the semiconductor package of example 1 and/or any other example disclosed herein, wherein the first portion may include one or more first conductive planes having a first thickness ranging from 50 μm to 500 nm. The second portion may include a metal redistribution layer (RDL) coupled to the one or more first conductive planes, the fourth device surface and the second die surface, and one or more second conductive planes having a second thickness ranging from 2 μm to 30 nm.

Example 3 may include the semiconductor package of example 2 and/or any other example disclosed herein, for which the one or more first and second conductive planes may include at least one power conductive plane associated to a power supply voltage, and at least one ground conductive plane associated to a ground reference voltage.

Example 4 may include the semiconductor package of example 2 and/or any other example disclosed herein, for which the second portion may further include a silicon or organic substrate on which the metal RDL is disposed.

Example 5 may include the semiconductor package of example 2 and/or any other example disclosed herein, wherein the first portion may include one or more epoxy mold layers interposed between the package substrate and the second portion of the bridge. The one or more first conductive planes may be disposed through the one or more epoxy mold layers.

Example 6 may include the semiconductor package of example 5 and/or any other example disclosed herein, for which the second portion may include an epoxy mold layer so that the second portion and the first portion are integrally formed.

Example 7 may include the semiconductor package of example 1 and/or any other example disclosed herein, for which the second portion of the bridge may extend at least partially over the first device, the second device and the base die.

Example 8 may include the semiconductor package of example 1 and/or any other example disclosed herein, further including one or more chiplets disposed on the second die surface, and coupled to the second device through the second portion of the bridge.

Example 9 may include the semiconductor package of example 8 and/or any other example disclosed herein, for which each of the one or more chiplets may include one among a central processing unit, a graphic processing unit, a system-on-chip, a radio frequency integrated circuit, a deep learning processor, a neural network processor and an input/output tile.

Example 10 may include the semiconductor package of example 1 and/or any other example disclosed herein, for which each of the first device and the second device may include a memory device.

Example 11 provides a method of manufacturing a semiconductor package, the method including forming one or more epoxy mold layers on a metal redistribution layer (RDL) of a bridge, removing a portion of the one or more epoxy mold layers to form one or more openings in the one or more epoxy mold layers, and forming one or more first conductive planes in the one or more openings. The method further includes attaching, to the metal RDL, a first device on which a second device is disposed, to form an assembly, attaching, to a package substrate, a base die on which one or more chiplets are disposed, and attaching the assembly to the package substrate and the base die that are attached to each other, so that the one or more first conductive planes and the first device are coupled to the package substrate and the metal RDL is coupled to the base die.

Example 12 may include the method of example 11 and/or any other example disclosed herein, further including forming an underfill layer between the package substrate and the one or more epoxy mold layers, the first device and the base die.

Example 13 may include the method of example 11 and/or any other example disclosed herein, further including forming solder balls on contact pads of the package substrate.

Example 14 may include the method of example 11 and/or any other example disclosed herein, for which each of the one or more chiplets may include one among a central processing unit, a graphic processing unit, a system-on-chip, a radio frequency integrated circuit, a deep learning processor, a neural network processor and an input/output tile.

Example 15 may include the method of example 11 and/or any other example disclosed herein, for which each of the first device and the second device may include a memory device.

Example 16 provides a computing device including a semiconductor package including a package substrate, a base die including a first die surface coupled to the package substrate, and a second die surface opposite to the first die surface, and a first device including a first device surface coupled to the package substrate, and a second device surface opposite to the first device surface. The semiconductor package further includes a second device including a third device surface coupled to the second device surface, and a fourth device surface opposite to the third device surface, a bridge including a first portion and a second portion coupled to the first portion, the fourth device surface and the second die surface, for which the first portion may include one or more first conductive planes interposed between the package substrate and the second portion of the bridge, and coupled to a metal distribution layer (RDL) having one or more second conductive planes in the second portion of the bridge.

Example 17 may include the computing device of example 16 and/or any other example disclosed herein, for which the bridge may include a silicon or organic substrate, and the RDL is disposed on the silicon or organic substrate, and coupled to the one or more first conductive planes, the fourth device surface and the second die surface.

Example 18 may include the computing device of example 16 and/or any other example disclosed herein, for which the one or more first and second conductive planes may include at least one power conductive plane associated to a power supply voltage, and at least one ground conductive plane associated to a ground reference voltage.

Example 19 may include the computing device of example 16 and/or any other example disclosed herein, for which the first portion may include one or more epoxy mold layers interposed between the package substrate and the second portion of the bridge. The one or more first conductive planes may be disposed through the one or more epoxy mold layers.

Example 20 may include the computing device of example 16 and/or any other example disclosed herein, further including one or more chiplets disposed on the second die surface, and coupled to the second device through the second portion of the bridge.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate;
a base die comprising a first die surface coupled to the package substrate, and a second die surface opposite to the first die surface;
a first device comprising a first device surface coupled to the package substrate, and a second device surface opposite to the first device surface;
a second device comprising a third device surface coupled to the second device surface, and a fourth device surface opposite to the third device surface; and
a bridge comprising a first portion coupled to the package substrate, and a second portion coupled to the first portion, the fourth device surface and the second die surface.

2. The semiconductor package of claim 1, wherein the first portion comprises one or more first conductive planes having a first thickness ranging from 50 µm to 500 µm,
wherein the second portion comprises a metal redistribution layer (RDL) coupled to the one or more first conductive planes, the fourth device surface and the second die surface, and one or more second conductive planes having a second thickness ranging from 2 µm to 30 µm.

3. The semiconductor package of claim 2, wherein the one or more first and second conductive planes comprises:
at least one power conductive plane associated to a power supply voltage; and
at least one ground conductive plane associated to a ground reference voltage.

4. The semiconductor package of claim 2, wherein the second portion further comprises a silicon or organic substrate on which the metal RDL is disposed.

5. The semiconductor package of claim 2, wherein the first portion further comprises one or more epoxy mold layers interposed between the package substrate and the second portion of the bridge,
wherein the one or more first conductive planes are disposed through the one or more epoxy mold layers.

6. The semiconductor package of claim 5, wherein the second portion comprises an epoxy mold layer so that the second portion and the first portion are integrally formed.

7. The semiconductor package of claim 1, wherein the second portion of the bridge extends at least partially over the first device, the second device and the base die.

8. The semiconductor package of claim 1, further comprising one or more chiplets disposed on the second die surface, and coupled to the second device through the second portion of the bridge.

9. The semiconductor package of claim 8, wherein each of the one or more chiplets comprises one among a central processing unit, a graphic processing unit, a system-on-chip, a radio frequency integrated circuit, a deep learning processor, a neural network processor and an input/output tile.

10. The semiconductor package of claim 1, wherein each of the first device and the second device comprises a memory device.

11. A computing device comprising:
a semiconductor package comprising:
a package substrate;
a base die comprising a first die surface coupled to the package substrate, and a second die surface opposite to the first die surface;
a first device comprising a first device surface coupled to the package substrate, and a second device surface opposite to the first device surface;
a second device comprising a third device surface coupled to the second device surface, and a fourth device surface opposite to the third device surface; and
a bridge comprising a first portion and a second portion coupled to the first portion, the fourth device surface and the second die surface, wherein the first portion comprises one or more first conductive planes interposed between the package substrate and the second portion of the bridge, and coupled to a metal redistribution layer (RDL) having one or more second conductive planes in the second portion of the bridge.

12. The computing device of claim 11, wherein the bridge comprises:
a silicon or organic substrate; and
the RDL is disposed on the silicon or organic substrate, and coupled to the one or more first conductive planes, the fourth device surface and the second die surface.

13. The computing device of claim 11, wherein the one or more first and second conductive planes comprises:
at least one power conductive plane associated to a power supply voltage; and
at least one ground conductive plane associated to a ground reference voltage.

14. The computing device of claim 11, wherein the first portion further comprises one or more epoxy mold layers interposed between the package substrate and the second portion of the bridge,
wherein the one or more first conductive planes are disposed through the one or more epoxy mold layers.

15. The computing device of claim 11, further comprising one or more chiplets disposed on the second die surface, and coupled to the second device through the second portion of the bridge.

* * * * *